United States Patent
Nagaraj et al.

(10) Patent No.: US 6,329,942 B1
(45) Date of Patent: *Dec. 11, 2001

(54) PARALLEL LATCH FOR HIGH SPEED COMPARATOR USING TWO MODES OF OPERATION

(75) Inventors: Krishnasawamy Nagaraj, Somerville; David A. Martin, Atlantic Highlands, both of NJ (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/494,382

(22) Filed: Jan. 31, 2000

(51) Int. Cl.[7] .................................................. H03M 1/36
(52) U.S. Cl. ..................................... 341/158; 341/159
(58) Field of Search .................................. 341/158, 159

(56) References Cited

U.S. PATENT DOCUMENTS

| 4,928,103 | * | 5/1990 | Lane | 341/159 |
| 5,680,133 | * | 10/1997 | Komatsu | 341/155 |
| 5,856,800 | * | 1/1999 | LePailleur et al. | 341/159 |
| 5,877,720 |   | 3/1999 | Setty et al. . | |
| 6,169,504 | * | 1/2001 | Park | 341/141 |

* cited by examiner

Primary Examiner—Howard L. Williams
(74) Attorney, Agent, or Firm—W. Daniel Swayze, Jr.; W. James Brady; Frederick J. Telecky, Jr.

(57) ABSTRACT

An A/D converter for sampling an input signal includes a reference circuit for generating a reference signal, a comparing circuit for comparing the input signal with the reference signal to produce a digital signal in response to the difference between the input signal and the reference signal, a first latch to latch the digital signal, a second latch to latch the digital signal, a first switch connected between the comparing circuit and the first latch, and a second switch connected between the comparing circuit and the second latch. The first switch and the second switch alternately operate.

8 Claims, 4 Drawing Sheets

PARALLEL LATCH FOR HIGH SPEED COMPARATOR USING TWO MODES OF OPERATION

FIELD OF THE INVENTION

The present invention relates to an analog-to-digital converter (A/D) converter, and more particularly to an A/D converter that provides higher resolution levels.

BACKGROUND OF THE INVENTION

A/D converters, in general, operate according to a particular set of specifications. The most important of these are the resolution (number of bits) and the sampling frequency. For example, an 8-bit, 400 MHz A/D converter has a resolution of 8 bits and can produce 400 million digital outputs in one second. Flash architecture is one well known method of implementing a high-speed A/D converter. An example of flash architecture is disclosed in an article entitled "A 400 MHz input flash converter with error correction," *IEEE Journal of Solid State Circuits*, Vol. 25, No. 1, pp. 184–191, Feb. 1990 (C. Mangelsdorf). A flash architecture requires $2^N$ comparators for N bit resolution. Thus, a major drawback of the flash architecture is that the size of the converter essentially doubles if the resolution is increased by one bit. As a consequence, the power dissipation also roughly doubles, making it almost impractical to use this architecture for more than 10 bits of resolution.

Magnetic mass storage devices, such as disk drives, are used to store large amounts of data, especially in computer systems. Computer drives include a plurality of magnetized disks and a spindle motor to rotate the disks. Data is stored on concentric data tracks on the surfaces of the magnetized rotating disks. A sensor (usually referred to as a read/write head) positioned proximate to the rotating disk and movable in a radial direction is used to detect (i.e., read) information in the form of analog signals from the disks. An important aspect of the operation of the disk drive is the positioning or location of the read/write head with respect to the magnetized tracks on the rotating disk. A servo mechanism is used to determine and control the exact position of the read/write head with respect to the disk so that data can be read from or written onto a specific sector and track on a specific disk.

Generally, two types of data or information are stored on the disk drive. The first type is user data, and that data is read during a user mode. The second type is servo data which is the data used by the servo mechanism to determine the position of the read/write head with respect to a specific sector on a specific track of the disk. The servo data is read in a servo mode.

The electronics that are used for these two read modes vary widely from one manufacturer to another since there is no standard as to how the two processes should be implemented. Typically, when reading data in both the user mode and the servo mode, an analog signal detected by the read head is first input into a very low-noise preamplifier which amplifies the signal. The amplified signal is then input into a read channel circuit. The read channel circuit is typically a single integrated circuit (IC) which directs the amplified signal to either the read path, which processes the user data, or the servo path, which processes the servo data. In either case, the front end of the read channel includes a voltage gain amplifier (VGA) and a continuous-time filter (CTF), being common to both the servo and read signal processing.

The processing circuitry for the user data is generally self-contained within the read channel IC. However, only part of the servo processing is done within the read channel IC. The majority of the servo processing, such as DSP operations and voice coil motor driving, is performed by separate circuits using one or more ICs. Essential to the read channel processing or the servo processing is the A/D converter for digitizing the analog signals. The position of the A/D converter within the read channel has changed over the years, tending to be moved earlier and earlier within the path of signal processing. Consequently, there is a need for an A/D converter that can convert the analog signal to a digital signal in an extremely fast time.

FIG. 3 illustrates a circuit schematic of a conventional comparator used in conjunction with a high-speed flash A/D converter. It includes preamplifier 300 which amplifies the difference between the input signal and a reference voltage. The amplified difference signal output from the preamplifier 300 is applied to a latch circuit 302 that converts the small signal into a logic level signal. The preamplifier 300 is made up of one or two amplifier stages that amplify the input signal typically by a factor of 10 or 20.

FIG. 4 illustrates waveforms associated with the A/D converter of FIG. 3. As can be seen from FIG. 4, when the clock signal is high, the latch 302 samples the output of the preamplifier 300, and after the clock signal goes low, the strobe signal goes high, forcing the latch to the output of preamplifier 300. This is followed by an Lreset signal during which the latch is reset. Thus, all the three operations, namely preamplification, latching and reset have to occur sequentially within one clock enterval. This leaves only a small interval for the latching operation. In high speed operations, this is insufficient to reach a complete decision whether the output is high or low. In very high-speed applications, the time available for latching, namely the time duration of the strb signal, may be insufficient to make a complete decision within this time.

SUMMARY OF THE INVENTION

An advantageous A/D converter that has a high level of resolution and high sampling speed is disclosed. The present invention includes a circuit to generate a plurality of reference signals, a circuit to compare the input signals with the reference signals and to produce digital signals corresponding to the difference between the input signals and the reference signals, and a multiplexer circuit for receiving the digital signals and outputting digital signals. Additionally, the present invention includes an encoder for encoding the output of the multiplexer circuit into N-bit digital signals. The present invention includes two latches in parallel. Each latch is connected to the same comparator.

DETAILED DESCRIPTION OF THE PRESENT INVENTION

Figure 1:
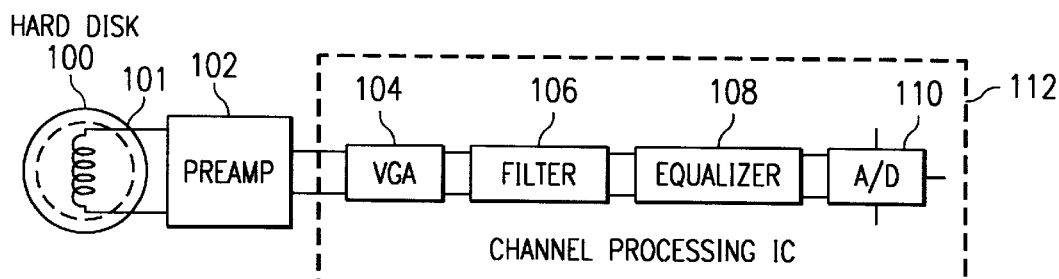
FIG. 1 illustrates a circuit for a portion of a read channel.

FIG. 1 illustrates a schematic block diagram of a portion of a read channel device using the flash A/D converter of the present invention. The read channel is illustrated generally at 112. A first motor (not shown) spins the magnetic disk 100, and a second motor (not shown) moves the read heads 101 in a radial direction with respect to disk 100. The signal path used to demodulate the user data includes a low-noise preamplifier 102, a variable gain amplifier (VGA)104, a low-pass filter 106, an equalizer 108, and an AND converter 110. It should be understood that other processing circuits are present within the read channel 112; however, these are not shown. Typically, the signal path used to demodulate the servo data signals is the same path used for the user data up to the A/D converter 110. The parallel lines connecting the above described circuit elements are used to transmit signals. These signals can be either single-ended or differential.

Figure 2:
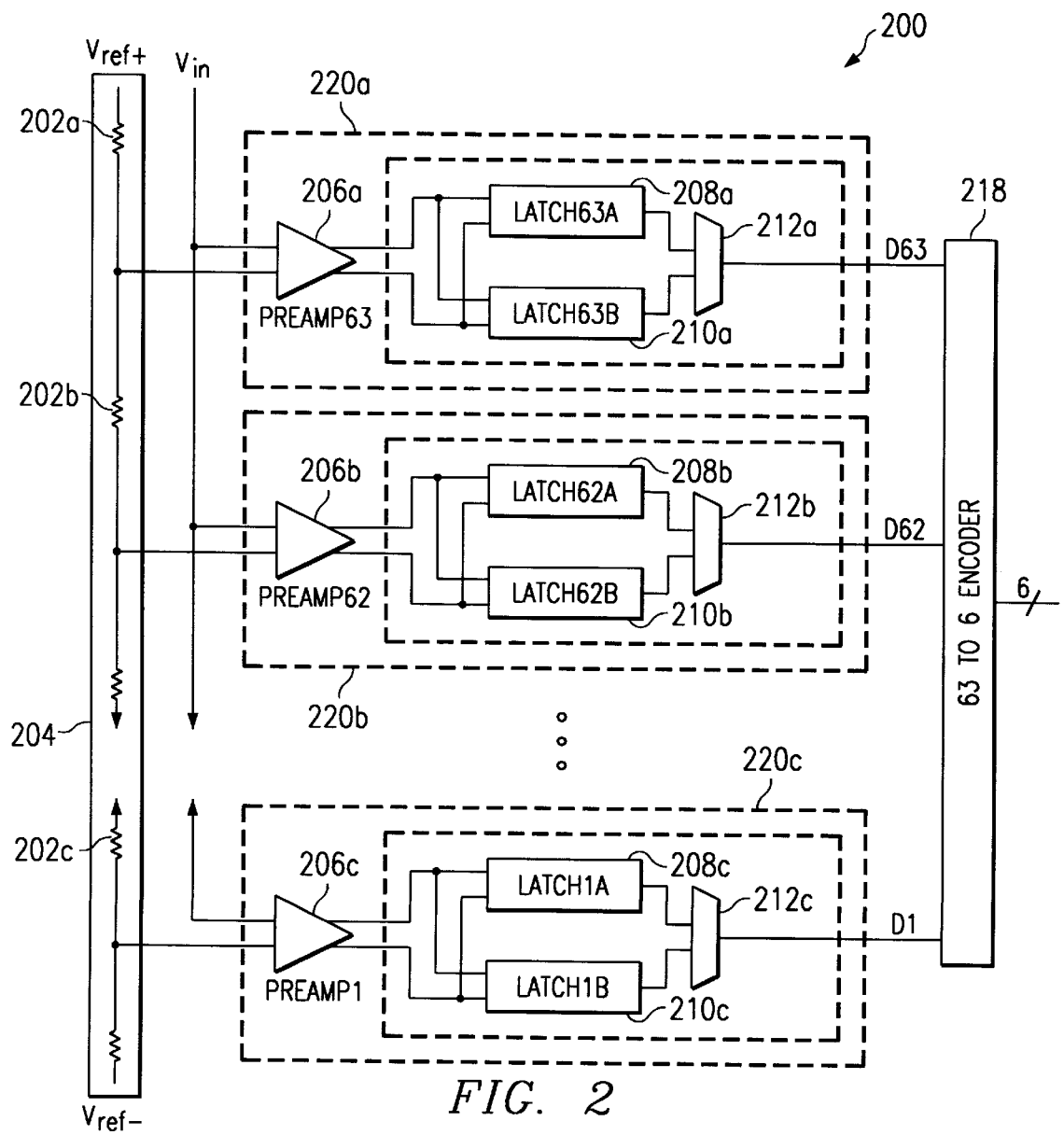
FIG. 2 illustrates a circuit in accordance with the present invention.

Referring now to FIG. 2, an A/D converter in accordance with the present invention is generally indicated by element 200. A set of reference voltages is generated by a reference circuit. The reference circuit could be a resistance ladder 204 including a plurality of resistors 202a–c, preferably, a plurality of resistors having the same or substantially similar resistance values. The number of reference voltages needed, and therefore the number of resistors 202 required in the resistance ladder 204, depends on the lowest resolution, N, of the A/D converter 200. As illustrated in FIG. 2, only five resistors are shown for the sake of simplicity. If the lowest resolution is to be 6 bits (N=6), then 64 reference voltages ($2^6$) are needed, and 63 ($2^6-1=63$) resistors are required. The A/D converter also includes $2^N$ comparators referred to by reference number 220. These three comparators 220 (220a, 220b and 220c) are illustrated in FIG. 2. Element 218 is a encoder.

Figure 5:
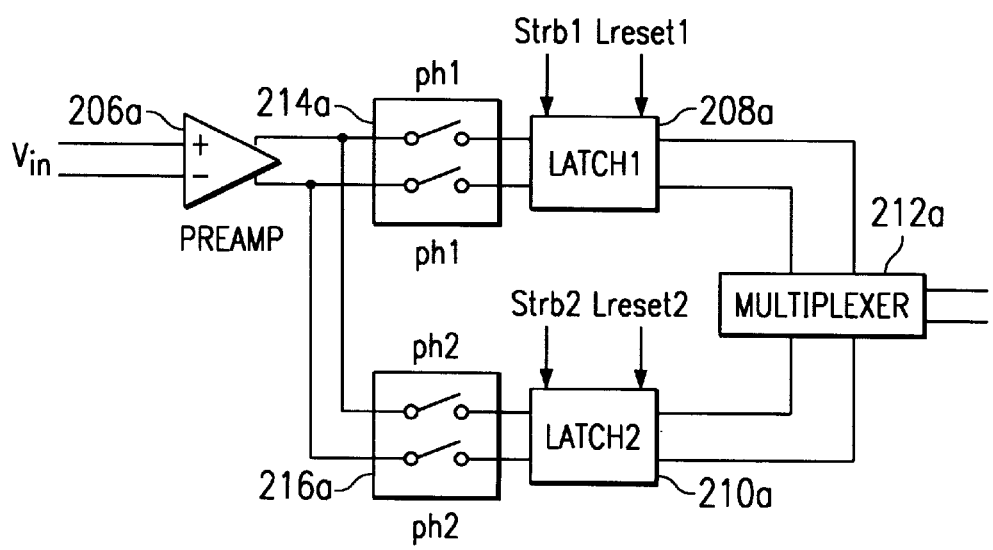
FIG. 5 illustrates a detail of an A/D converter of the present invention.

FIG. 5 illustrates a detailed view of one of the comparators 220. To distinguish between several identical comparators 220, the subcomponents thereof are designated with letters. Preamplifier 206a is associated with comparator 220a; preamplifier 202b is associated with comparator 220b, etc. Each comparator 220 preferably has one voltage input $V_{in}$, one reference input $V_{ref}$, and two outputs. Two outputs are used when the output is differential. A single-ended output would have one output. Either type of output works equally well. Each comparator 220 includes an preamplifier 206a, a first switch 214a, a first latch 208a, a second switch 216a, a second latch 210a, and a multiplexer 212a. The output of preamplifier 206a is connected to first switch 214a, which is connected to the input of first latch 208a and is connected to second switch 216a, which is connected to second latch 210a. The output of first latch 208a is coupled to the input of multiplexer 212a, and the output of second latch 210a is coupled to multiplexer 212a. As a consequence, the first latch 208a and the second latch 210a are considered to be connected in parallel. The value of the reference voltage $V_{ref}$ being input to each comparator 220 will vary depending on the number of resistors 202 and the voltage $V_R$ being applied to the top of the resistance ladder 204.

Figure 3:
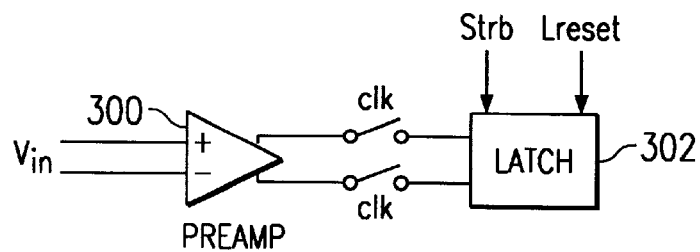
FIG. 3 illustrates an A/D converter.

This problem of the latch being unable to reach a complete decision of whether the output is high or low is overcome by using two latches, 208a and 210a, in parallel, as shown in FIG. 5. This is a parallel mode of operation. Here the two latches, 208a and 210a, operate on alternate clock cycles. Their outputs are multiplexed by multiplier 212a to generate the output. The time available for the regenerative amplification by the latches 208a and 210a here is more than twice that in the conventional scheme of FIG. 3. Because the two latches in FIG. 5 operate at half rate, the power dissipation of the latches 208a and 210a is about the same as that of the single latch in FIG. 3.

Figure 4:
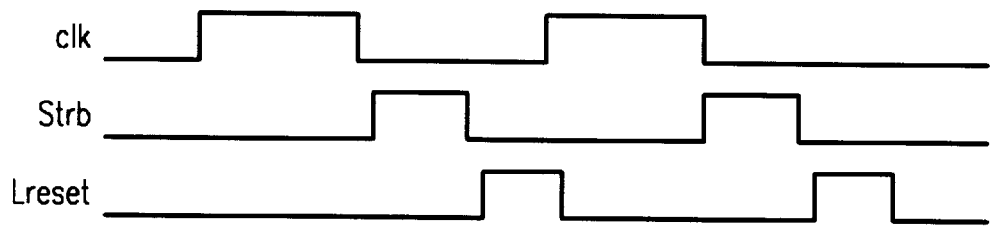
FIG. 4 illustrates waveforms of the A/D converter.
Figure 6:
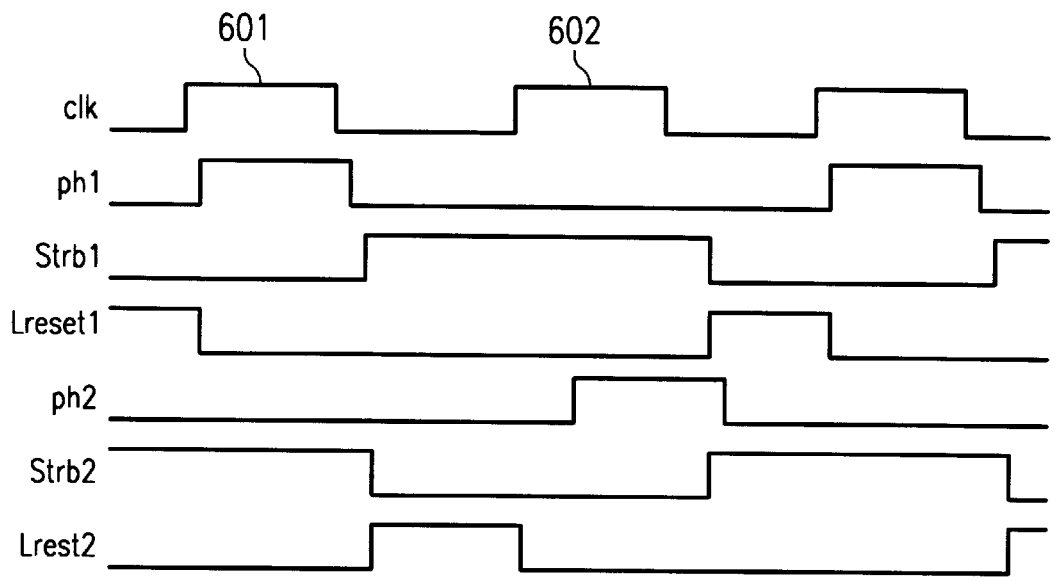
FIG. 6 illustrates waveforms associated with FIG. 5.

The switches 214a and 216a are operated in response to signal Ph1 for first switch 214a and to signal Ph2 for second switch 216a. Thus, when signal Ph1 is high, switch 214 is closed, allowing the output of amplifier 206a to be input to first latch 208a. In a similar fashion, when the signal Ph2 is high, switch 216 is closed, connecting the output of amplifier 206a to second latch 210a. The waveforms for the clock, the switch signal Ph1, the switch signal Ph2, the strobe signal strb1, the strobe signal strb2, and the latch reset signal Lreset1 and the latch reset signal Lreset2 are illustrated in FIG. 6. The switch signal Ph1 and the switch signal Ph2 are in phase with alternating clock pulse signals. As a consequence, first latch 208a is active to receive data from the amplifier 206 during a first clock pulse 601, and on the successive clock pulse 602, the latch signal 210a can receive data from amplifier 206a. The alternate operation of first latch 208a and second latch 210a allows for increased speed of the A/D converter. The increased width of the strobe signal strb1 and the strobe signal strb2 allows for the increased speed. When the first latch 208a is sampling the output of the amplifier 206a, second latch 210a is latching the previous sample and vice versa. With this, the width of the strobe pulse can be sufficiently long as a complete clock interval. Thus, the time available for latching with first latch 208a and second latch 210a being connected in parallel is two to three times that of the circuit as illustrated in FIG. 4. This avoids the need for the cascade of latches. Although the circuit of FIG. 5 and FIG. 2 increases the number of required latches, latches 208a and 210a operate at half the speed of cascaded latches and do not dissipate more power.

Figure 7:
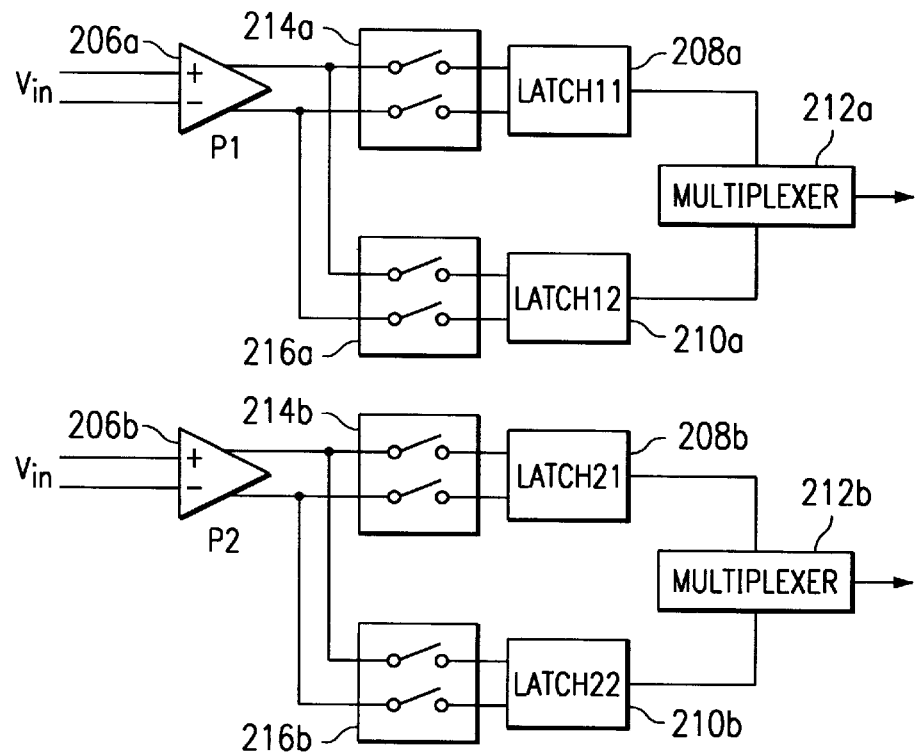
FIG. 7 illustrates another detail of an AND converter of the present invention.
Figure 8:
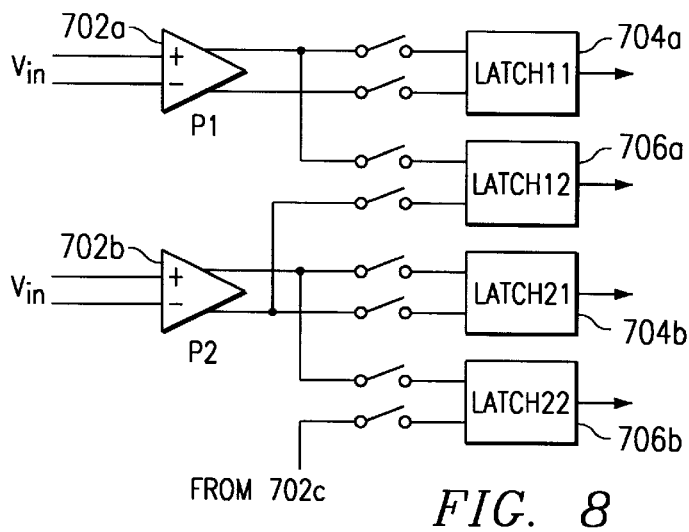
FIG. 8 illustrates another detail of the A/D converter of the present invention.

In a read channel application, there is need to periodically process servo data (this is required for track positioning). The precision required by this operation is higher than the precision required while processing user data. For this reason, 7-bit A/D conversion is required for servo processing. Fortunately, the sampling rate required by servo data is significantly smaller than that required by user data. Taking advantage of this, the 6-bit A/D converter that is used for user data processing can be reconfigured to work as a 7-bit converter by using interpolating latches. The scheme of FIG. 5 allows us to achieve this in a very efficient manner. FIG. 7 shows a section of the comparator array in the 6-bit mode. This looks exactly like the circuit of FIG. 5. For the 7-bit operation, the same comparator array is re-configured as shown in FIG. 8. Here the Latch 706a, recieves one input from preamplifier 702a and the other input from preamplifier 702b. Thus, its effective input is the average of the outputs of preamplifier 702a and preamplifier 702b. The output of latch 706a represents an extra quantization level between the outputs of Latch 704a and Latch 704b.

Note that in the 7-bit mode, each latch is operating at full speed. However, because the speed requirement in the 7-bit mode is significantly smaller, a single latch is adequate. The A/D converter can be switched between the two modes in a very simple manner, with the help of a few additional switches.

Figure 10:
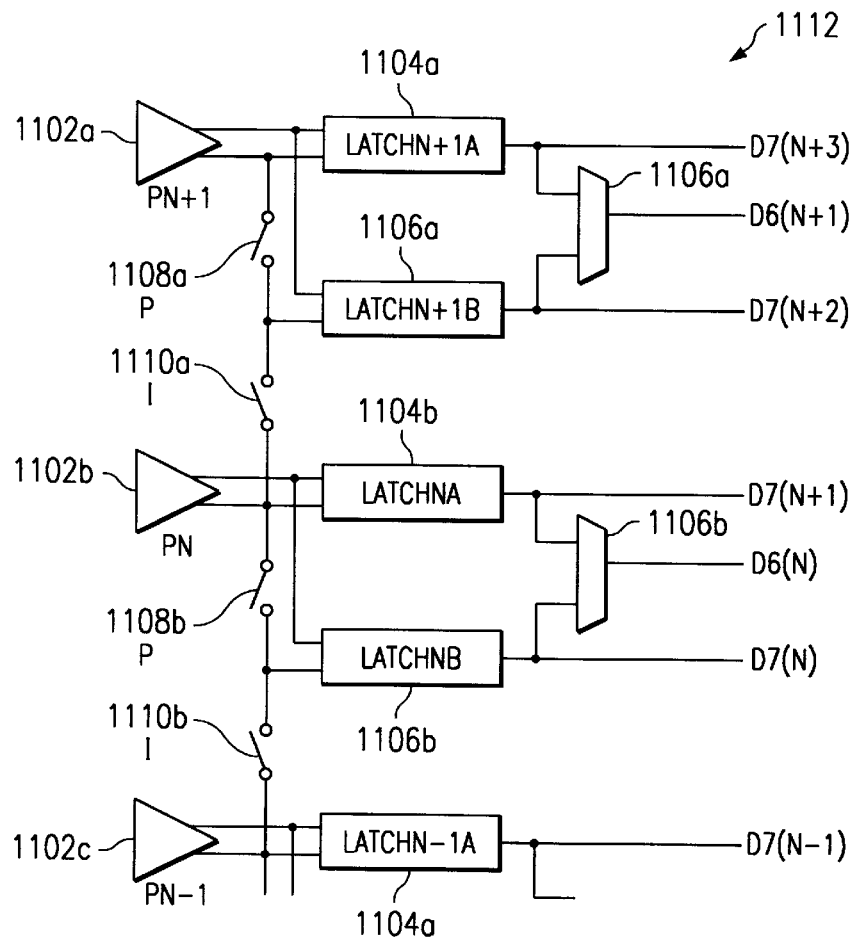
FIG. 10 illustrates a switched latch circuit of the present invention.

FIG. 10 illustrates a switchable latch circuit 1112 to operate either in parallel mode or interpolation mode. In the parallel mode, switches 1108a and 1108b are closed, and switches 1110*a* and 1110*b* are open, and the output is obtained directly from latches 1104*a*, 1106*a* and 1104*b*, 1106*b*.

Figure 9:
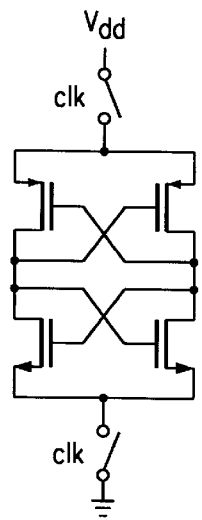
FIG. 9 illustrates a latch circuit of the present invention.

FIG. 9 shows an implementation of the latch circuit used with the present invention. The invention described is not restricted to this particular latch design.

What is claimed is:

1. An A/D converter for sampling an input signal, comprising:

a first reference circuit for generating a first reference signal;

a second reference circuit for generating a second reference signal;

a first comparing circuit for comparing said input signal with said first reference signal to produce a first digital signal in response to said difference between said input signal and said first reference signal;

a second comparing circuit for comparing said input signal with said second reference signal to produce a second digital signal in response to said difference between said input signal and said second reference signal;

a first latch to latch said first digital signal;

a second latch to latch said first digital signal or said second digital signal;

a first switch connected between said first comparing circuit and said second latch; and a second switch connected between said second comparing circuit and said second latch;

wherein said first switch and said second switch operate to switch between an interpolation mode and a parallel mode.

2. An A/D converter for sampling an input signal, as in claim 1, wherein said plurality of reference circuits form a resistance ladder.

3. An A/D converter for sampling an input signal, as in claim 1, wherein said A/D converter further comprises a multiplexer coupled to said first latch and said second latch in the parallel mode.

4. An A/D converter for sampling an input signal, as in claim 1, wherein said A/D converter does not multiplex the output of said first latch and said second latch in the interpolation mode.

5. A method for operating an A/D converter, comprising the steps of:

sampling an input signal;

generating a first reference signal;

generating a second reference signal;

comparing said input signal with said first reference signal to produce a first digital signal in response to said difference between said input signal and said first reference signal;

latching said first digital signal by a first latch;

comparing said input signal with said second reference signal to produce a second digital signal in response to said difference between said second reference signal and said input signal;

latching said first digital signal or said second digital signal by a second latch;

switching a first switch connected between said first comparing circuit and said second latch; and switching a second switch connected between said second comparing circuit and said second latch;

wherein said first switch and said second switch operate to switch between an interpolation mode and a parallel mode.

6. A method for operating an A/D converter, as in claim 5, wherein a resistance ladder is formed to generate said plurality of first and second reference signals.

7. A method for operating an A/D converter, as in claim 5, wherein said first latch and an output of said second latch are multiplexed together in the parallel mode.

8. A method for operating an A/D converter, as in claim 5, wherein said first latch and an output of said second latch are not multiplexed together in the interpolation mode.

\* \* \* \* \*